US007759228B2

(12) United States Patent
Sugiyama et al.

(10) Patent No.: US 7,759,228 B2
(45) Date of Patent: Jul. 20, 2010

(54) SEMICONDUCTOR DEVICE AND METHOD OF MANUFACTURING THE SAME

(75) Inventors: Naoharu Sugiyama, Yokohama (JP);
Norio Hirashita, Higashiyamato (JP);
Tsutomu Tezuka, Yokohama (JP)

(73) Assignees: Kabushiki Kaisha Toshiba, Tokyo (JP);
Oki Electric Industry Co., Ltd., Tokyo (JP)

( * ) Notice: Subject to any disclaimer, the term of this patent is extended or adjusted under 35 U.S.C. 154(b) by 762 days.

(21) Appl. No.: 11/449,687

(22) Filed: Jun. 9, 2006

(65) Prior Publication Data
US 2006/0281234 A1    Dec. 14, 2006

(30) Foreign Application Priority Data
Jun. 13, 2005   (JP)   ............... 2005-172548

(51) Int. Cl.
H01L 21/84   (2006.01)
H01L 21/324  (2006.01)
H01L 21/20   (2006.01)

(52) U.S. Cl. ............... 438/479; 117/7; 117/9; 117/939; 438/796; 257/E21.12

(58) Field of Classification Search ............... 438/479, 438/767, 795, 796; 117/7, 9, 939; 257/E21.12
See application file for complete search history.

(56) References Cited

U.S. PATENT DOCUMENTS

| 4,975,387 | A | * | 12/1990 | Prokes et al. | ............... 438/486 |
| 6,369,438 | B1 | | 4/2002 | Sugiyama et al. | |
| 7,084,460 | B2 | * | 8/2006 | Chen et al. | ............... 257/347 |
| 7,332,417 | B2 | * | 2/2008 | Westhoff et al. | ............... 438/509 |

(Continued)

FOREIGN PATENT DOCUMENTS

JP    2000-243946    9/2000

(Continued)

OTHER PUBLICATIONS

Tezuka et al.; "A Novel Fabrication Technique of Ultrathin and Relaxed SiGe Buffer Layers With High Ge Fraction for Sub-100nm Strained Silicon-On-Insulator MOSFETs"; Japanese Journal of Applied Physics, vol. 40, pp. 2866-2874, (2001).

(Continued)

Primary Examiner—Mary Wilczewski
(74) Attorney, Agent, or Firm—Finnegan, Henderson, Farabow, Garrett & Dunner, L.L.P.

(57) ABSTRACT

A method of manufacturing a semiconductor device. In the method, a substrate is prepared, which includes a buried oxide film and a SiGe layer formed on the buried oxide film. Then, heat treatment is performed on the substrate at a temperature equal to or lower than a first temperature, to form a protective oxide film on a surface of the SiGe layer. Next, the substrate having the protective oxide film is heated in a non-oxidizing atmosphere to a second temperature higher than the first temperature. Further, heat treatment is performed on the substrate thus heated, in an oxidizing atmosphere at a temperature equal to or higher than the second temperature, to form oxide the SiGe layer, make the SiGe layer thinner and increasing Ge concentration in the SiGe layer, thus forming a SiGe layer having the increased Ge concentration.

11 Claims, 4 Drawing Sheets

U.S. PATENT DOCUMENTS

| | | | |
|---|---|---|---|
| 7,501,318 B2* | 3/2009 | Bedell et al. | 438/151 |
| 2003/0049919 A1* | 3/2003 | Yamamoto | 438/592 |
| 2005/0003229 A1* | 1/2005 | Bedell et al. | 428/641 |
| 2005/0139961 A1* | 6/2005 | Brunner et al. | 257/616 |
| 2005/0215071 A1* | 9/2005 | Moriceau et al. | 438/770 |
| 2006/0024908 A1* | 2/2006 | Neyret et al. | 438/398 |
| 2006/0094171 A1* | 5/2006 | Liaw | 438/149 |
| 2006/0214257 A1* | 9/2006 | Ninomiya et al. | 257/502 |
| 2006/0281234 A1* | 12/2006 | Sugiyama et al. | 438/151 |
| 2007/0207598 A1* | 9/2007 | Damlencourt et al. | 438/479 |
| 2008/0135830 A1* | 6/2008 | Westhoff et al. | 257/19 |

FOREIGN PATENT DOCUMENTS

| | | |
|---|---|---|
| JP | 2002-76347 | 3/2002 |
| JP | 2002-356399 | 12/2002 |
| JP | 2006-270000 | 10/2006 |
| WO | WO 2006/033292 | 3/2006 |

OTHER PUBLICATIONS

Tezuka et al.; "Fabrication of Strained Si on an Ultrathin SiGe-On-Insulator Virtual Substrate With a High-Ge Fraction"; Applied Physics Letters, vol. 79, No. 12, pp. 1798-1800, (Sep. 2001).

Sugiyama et al.; "Temperature Effects on Ge Condensation by Thermal Oxidation of SiGe-On-Insulator Structures"; Journal of Applied Physics, vol. 95, No. 8, pp. 4007-4011, (2004).

Nakaharai et al.; "Strain Relaxation Mechanism of SiGe-On-Insulator Layer in the Ge-Condensation Technique"; Proceedings of the $3^{rd}$ International Conference of Si Epitaxy and Heterostructure, 3 sheets, (2003).

Tezuka et al.; "Lattice Relaxation and Dislocation Generation/Annihilation in SiGe-On-Insulator Layers During Ge Condensation Process"; Proceeding of the $4^{th}$ Intenrnational Conference of Si Epitaxy and Heterostructure, 2 sheets, (2005).

A Notification of Reasons for Rejection mailed by the Japanese Patent Office on May 19, 2009, for Japanese Application No. 2005-172548 with an English translation.

Waltereit, P. et al., "Si/SiGe quantum wells grown on vicinal Si(001) substrates: Morphology, dislocation dynamics, and transport properties" Applied Physics letters, vol. 72, No. 18, May 4, 1998.

A Final Notice of Rejection mailed by the Japanese Patent Office on Aug. 25, 2009, for Japanese Application No. 2005-172548.

* cited by examiner

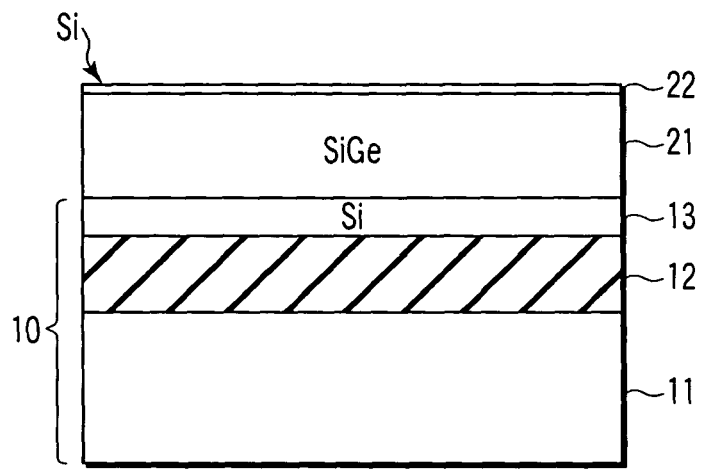
F I G. 1A
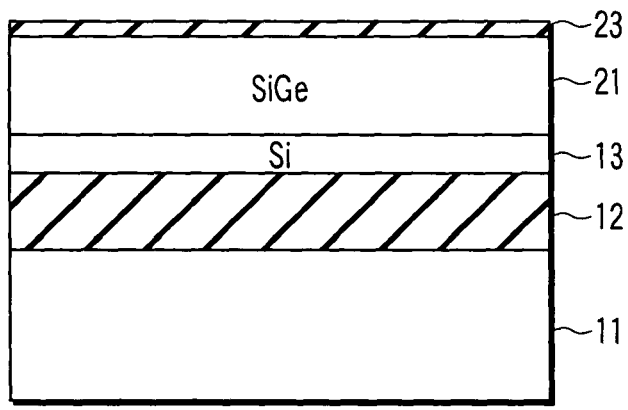
F I G. 1B
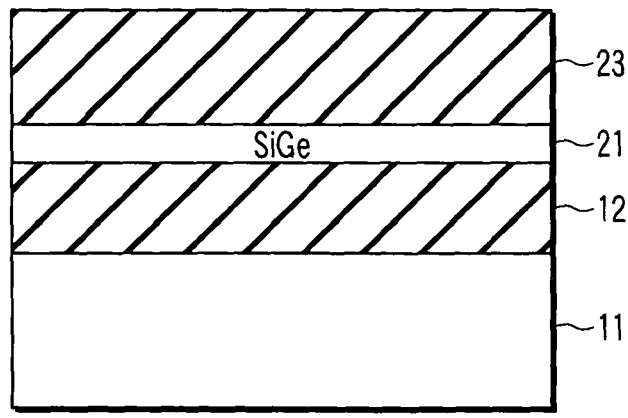
F I G. 1C

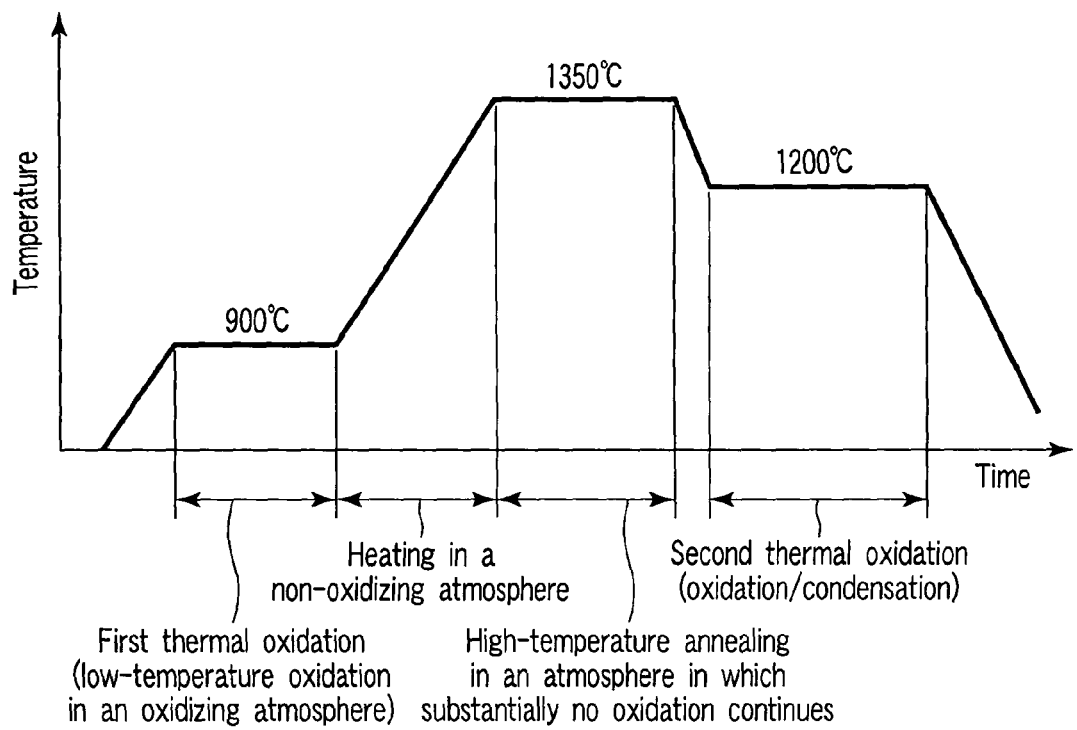
F I G. 4
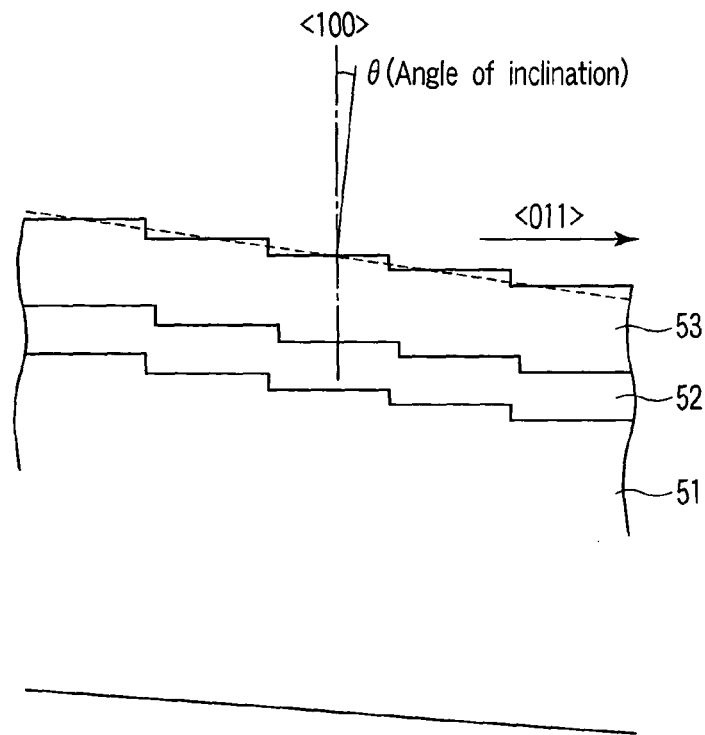
F I G. 5

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-172548, filed Jun. 13, 2005, the entire contents of which are incorporated herein by reference.

BACKGROUND OF THE INVENTION

1. Field of the Invention

The present invention relates to techniques of manufacturing a semiconductor device that has semiconductor thin-film crystals, each having lattice strain. More particularly, the invention relates to a semiconductor device and a method of manufacturing the same by utilizing oxidation and Ge condensation.

2. Description of the Related Art

In recent years, a so-called strained Si-on-insulator (SOI) structure has attracted much attention. The strained SOI structure is a combination of a strained Si structure and a SOI structure comprising buried oxide film and a thin-film Si crystal layer provided on the oxide film. The strained SOI structure comprises a SiGe-on-insulator (SGOI) crystal layer and a strained Si crystal layer. The SGOI crystal layer is a lattice-relaxed layer that is formed on the buried oxide film and about 10 to 200 nm thick. The strained Si crystal layer is provided on the SGOI crystal layer and about 5 to 30 nm thick. Using the strained SOI structure, a field-effect transistor (FET) may be manufactured, whose channel layer is the strained Si crystal layer. The strained Si crystal layer and the SOI structure impart high channel mobility and low capacitance to the FET, respectively. Hence, a semiconductor device of extremely high performance can be provided.

Oxidation and Ge condensation is known as a method of providing an SGOI substrate, on which the strained SOI structure may be fabricated. (See Jpn. Pat. Appln. Publication No. 2002-76347.) In this method, a thin SiGe film having Ge composition of 10% and being about 100 to 500 nm thick is formed on an SOI substrate that comprises a buried oxide film and a Si layer formed on the buried oxide layer and about 30 to 50 nm thick. Then, the resultant structure is subjected to thermal oxidation at high temperature. During the thermal oxidation, Ge atoms diffuse from the SiGe crystal layer into the Si crystal layer. As a result, the SiGe crystal layer and the Si crystal layer fuse together and become thinner. During the thermal oxidation, Ge atoms are rejected from the oxide interface to the SiGe crystal layer, without combining with oxygen atoms. Nonetheless, they do not diffuse into the substrate through the oxide film. Thus, Ge atoms are accumulated in only the crystal layer between the oxide films.

Hence, the Ge concentration increases as the SiGe crystal layer becomes thinner. If a SiGe crystal layer that has Ge composition of 10% and a thickness of 300 nm is formed on an SOI substrate having a Si layer having a thickness of 50 nm and then thermally oxidized in part at 1200° C., forming an oxide film having thickness of 550 nm, an SGOI substrate that has Ge composition of 30% and a thickness of 100 nm will be provided.

As is known in the art, an SGOI substrate manufactured by means of oxidation and Ge condensation has an SGOI layer that has many threading dislocations, due to the behavior the Ge atoms accumulated in the crystal layer interposed between the oxide films and the stress resulting from the behavior of the Ge atoms. As is known, too, plane defect generates in orthogonal directions, due to twin crystals or stacking fault. The threading dislocations or the plane defect imposes adverse influence, such as leakage current, on the characteristics of the FET that has a SI layer formed on the SGOI substrate.

BRIEF SUMMARY OF THE INVENTION

According to an aspect of this invention, there is provided a method of manufacturing a semiconductor device, comprising:

preparing a substrate including a buried oxide film and a SiGe layer formed on the buried oxide film;

performing heat treatment on the substrate at a temperature equal to or lower than a first temperature to form a protective oxide film on a surface of the SiGe layer;

heating the substrate including the protective oxide film, in a non-oxidizing atmosphere to a second temperature higher than the first temperature; and performing heat treatment on the substrate thus heated, in an oxidizing atmosphere at a temperature equal to or higher than the second temperature, to oxidized the SiGe layer, make the SiGe layer thinner and increase Ge concentration in the SiGe layer for forming a SiGe layer having the increased Ge concentration.

According to another aspect of the invention, there is provided a method of manufacturing a semiconductor device, comprising:

preparing a substrate including one of a layer containing oxygen and Si atoms and a layer containing oxygen, Si atoms and Ge atoms, and a SiGe layer formed on the layer;

performing heat treatment on the substrate at a temperature equal to or lower than a first temperature to form a protective oxide film on a surface of the SiGe layer;

heating the substrate including the protective oxide film, in a non-oxidizing atmosphere to a second temperature higher than the first temperature; and performing heat treatment on the substrate thus heated, in an oxidizing atmosphere at a temperature equal to or higher than the second temperature to form a buried oxide film in the substrate, and oxidize the SiGe layer, make the SiGe layer thinner and increase Ge concentration in the SiGe layer for forming a SiGe layer having the increased Ge concentration in the vicinity of the buried oxide film.

According still another aspect of the invention, there is provided a method of manufacturing a semiconductor device, comprising:

forming a SiGe layer on a major surface of an SOI substrate, which has an orientation axis tilting by 0.5 to 2 degree from <100> axis to <011> axis;

heating the substrate at a temperature equal to or lower than a first temperature to form a protective oxide film on a surface of the SiGe layer; and performing a heat treatment on the substrate including the protective oxide film, in an oxidizing atmosphere at a second temperature higher than the first temperature to oxidize the SiGe layer and make the SiGe layer thinner for forming a SiGe layer having an increased Ge concentration.

According a further aspect of the invention, there is provided a semiconductor device comprising:

a SiGe layer formed on an insulating film and having an orientation axis that tilts in a major surface by 0.5 to 2 degree from <100> axis to <011> axis; and an MOS transistor fabricated on one of the SiGe layer and a semiconductor layer formed on the SiGe layer, and having a channel which extends along <011> axis.

BRIEF DESCRIPTION OF THE SEVERAL VIEWS OF THE DRAWING

FIGS. 1A to 1C are sectional views showing the steps of manufacturing a semiconductor device according to a first embodiment of this invention;

FIG. 4 is a diagram representing the temperature profile set for the heat treatment performed in the second embodiment;

FIG. 5 is a schematic diagram explaining a third embodiment of the invention, illustrating a substrate that has an orientation axis that tilts a little;

DETAILED DESCRIPTION OF THE INVENTION

Figure 2:
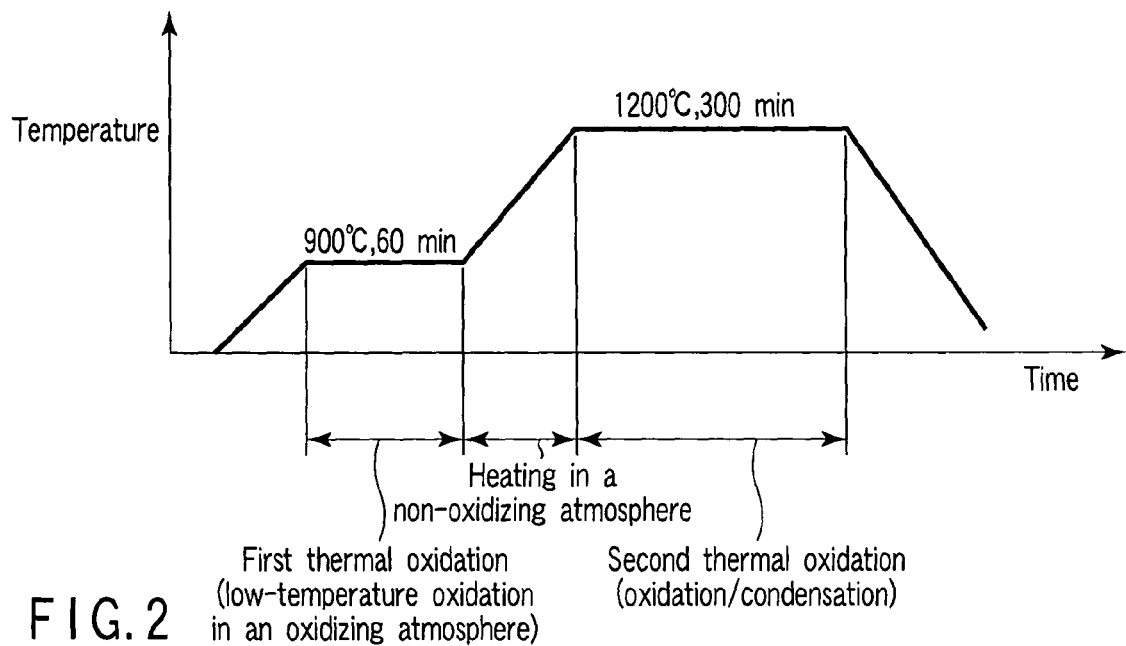
FIG. 2 is a diagram representing the temperature profile set for the heat treatment performed in the first embodiment.

Embodiments of the present invention will be described in detail, with reference to the accompanying drawings.

First Embodiment

FIGS. 1A to 1C are sectional views showing the steps of manufacturing a semiconductor device according to a first embodiment of the invention.

First, an SOI substrate 10 is thereby prepared, which has, as shown in FIG. 1A, a Si (SOI) layer 13 having thickness of 50 nm is formed on a Si substrate 11 having plane orientation (100) through a buried oxide film 12. A thin film of SiGe alloy crystal is grow on the substrate 10, by using a vacuum CVD apparatus. The thin film is formed at substrate temperature of 600° C., with disilane partial pressure of 20 mPa and germane partial pressure of 30 mPa. A SiGe layer 21 having Ge composition of 10% and thickness of 180 nm is thereby formed.

The SiGe layer 21 remains in a strained state. After the SiGe layer 21 has been grown, the supply of germane gas is stopped. The growth of the Si layer is continued at the substrate temperature of 600° C. and the disilane partial pressure of 8 mPa. A Si cap layer (protective film) 22 having thickness of 10 nm is thereby formed as uppermost layer. The SiGe layer 21 and the Si cap layer 22 are formed, one after the other, on the SOI substrate 10 having the buried oxide film 12.

Next, the laminated substrate of the structure shown in FIG. 1A is subjected to heat treatment of the temperature profile shown in FIG. 2. First, the first thermal oxidation is performed in an oxidation furnace. This thermal oxidation may be a thermal oxidation process that is employed in the ordinary method of manufacturing semiconductor devices. In the present embodiment, the first thermal oxidation is carried out in a dry 100%-oxygen atmosphere, at 900° C. for 60 minutes. During this step, the entire Si cap layer 22 and the surface region of the SiGe layer 21 are oxidized as is illustrated in FIG. 1B. As a result, an oxide film (protective film) 23 about 17 nm thick is formed on the surface of the SiGe layer on the SOI substrate.

In this embodiment, the thickness of the oxide film 23 formed during the first thermal oxidation is an important factor. It is desired that the thickness be 5 nm to 50 nm. The oxidation temperature is an important factor, too. It should be 1000° C. or less in order to prevent pile-up of Ge. The oxidation atmosphere and the oxidation time are less important than the oxidation temperature and the thickness of the oxide film 23. They can be changed in some range, so long as the thickness of the oxide film and the oxidation temperature are satisfactory. The lower limit of the oxidation temperature is not important and can be set to a given value.

To perform thermal oxidation in a dry oxygen atmosphere as in the present embodiment, it is desired that the oxidation temperature be 750° C. or more in order to provide an oxide film of a desired thickness within a sufficiently short time. Nonetheless, the thermal oxidation can be performed at a lower temperature if a method of enhancing oxidation at low temperatures, such as plasma-decomposition of oxygen molecules, is carried out at the same time. The oxide film may be formed by another method. It can be formed by oxidizing the surface region of a Si layer as described above, or by introducing Si atoms on the substrate crystal by means of, for example, CVD.

If an oxide film is deposited by means of CVD, however, the oxide film has low density immediately after it is formed. Thus, densification will take place, i.e., increase in the density of the oxide film, when the film is subjected to the next high-temperature process (second thermal oxidation, i.e., oxidation and Ge condensation). The densification applies a compressing stress to the SiGe crystal. Hence, if the oxide film is deposited by CVD, the stress that relaxes the SiGe crystal may inevitably be decreased by the oxidation and Ge condensation.

The process of thermally oxidizing the Si atoms of the substrate crystal makes the oxide film exert a tensile stress on the under-layer crystal. The oxidation of Si atoms well conforms to the oxidation and Ge condensation. It is desired that no germanium exists in the surface region of the substrate crystal when during the thermal oxidation of Si atoms. This is because Si atoms may readily combine with oxygen atoms during the thermal oxidation and Ge atoms are accumulated in the interface between the resultant oxide film and the substrate crystal. The Ge atoms thus accumulated may result in defects.

In view of this, it is desired that the SiGe layer (i.e., thin film grown on the SOI substrate) be protected by the Si cap layer, not having exposed surface. The thickness of the Si cap layer is determined by the thickness of the oxide formed by the first thermal oxidation. That is, if the oxide film is 20 nm thick, the cap layer needs to be 9 to 10 nm thick. The accumulation of Ge atoms in the above-mentioned interface can be suppressed by optimizing the thermal oxidation temperature. In this case, the Si cap layer need not be provided.

After the first oxidation is performed, the sample is heated to 1200° C. In this embodiment, this heating is carried out in a dry nitrogen atmosphere. The atmosphere in which the heating must be a non-oxidizing atmosphere, though not limited to a dry nitrogen atmosphere. Preferably, it is of nitrogen gas or inert gas.

This is because, if the oxidation is effected at 1000° C. to 1100° C., many Ge atoms not taken into the thermally oxidized film during the oxidation will be accumulate in the vicinity of the interface, due to the relation between the oxidation speed and the speed of Ge diffusion in the SiGe crystal. The Ge atoms so accumulated result in threading dislocations. Hence, the above-mentioned "non-oxidizing atmosphere" may be one that does not practically make the oxidation proceed. A small amount of oxygen allowed to be contained.

Generally, oxidation steps are achieved at 1100° C. or more. At such a high temperature, both the oxidation speed and the Ge-diffusion speed are high, causing no problems. However, the substrate is heated at lower temperature, before its temperature reaches 1100° C. or more. At 1100° C. or less, oxidation proceeds fast and Ge diffuses slowly. Consequently, Ge pile-up takes place. The Ge pile-up does not occur if the substrate is heated in a non-oxidizing atmosphere. Nevertheless, if Ge exists in the surface region of the substrate, the surface of the substrate will be roughened when it heated even in a non-oxidizing atmosphere.

In the present embodiment, the substrate is oxidized, first at a low temperature of 1000° C. or less, thereby forming a protective film on the surface of the substrate. At the temperature of 1000° C. or less, the oxidation speed is high and the Ge-diffusion speed is low. Therefore, no Ge-pile up will take place. Thanks to the protective film existing on the substrate, the surface of the substrate is not roughened when the substrate is heated in the non-oxidizing atmosphere.

Next, the substrate is heated from the above-mentioned temperature to 1200° C. Subsequently, the substrate is subjected to annealing (second thermal oxidation) at a high temperature in an atmosphere of high oxygen concentration. More specifically, the second thermal oxidation was carried out at 1200° C. for 300 minutes in a dry oxygen atmosphere. This oxidation makes the oxide layer on the surface grow to be 500 nm thick, as may be seen from FIG. 1C. The resultant structure is a multi-layer one composed of the Si substrate 11, the buried oxide film 12, SiGe layer 21 (thickness: 80 nm) and surface thermally oxide film 23 (Ge composition: 22%; thickness: 80 nm).

It is noted here that not only the oxide film 23 formed on the surface, but also the buried oxide film 12 has grown thicker. The buried oxide film 12 has so grown, probably because oxygen is supplied from the surface through the SiGe layer 21. Although both oxide films 12 and 23 have grown thicker and the SiGe layer 21 has become thinner, Ge atoms scarcely exist in the oxide films 12 and 23. This is because Ge atoms expelled into the SiGe crystal layer 21, no not taken into the thermally oxidized film 12 or 23. As a result, Ge concentration rises in the SiGe layer 21 that is interposed between the oxide films 12 and 23. The lattice strain in the SiGe layer 21 is relaxed. During the second high-temperature oxidation, the thin SOI layer 13 fuses with the SiGe crystal layer 21 as Ge diffuses into it from the SiGe crystal layer 21 formed on it.

The second high-temperature oxidation may be performed longer, then, the oxide film on the surface and the buried oxide film become thicker so that the SiGe layer 21 may be even thinner and has a higher Ge concentration. If the SiGe layer 21 has a higher Ge concentration, however, it may be degraded when the high-temperature oxidation is carried out. In some cases, Ge atoms extract from the SiGe layer 21 and Ge melted, raising the vapor pressure. Such a rise of vapor pressure may cause bumping in the worst case.

To avoid this, it is effective to lower the temperature to which the substrate is heated. This temperature may be set at a value within the range from 1100° C. to 1350° C. in this invention, though the substrate is heated to 1200° C. in this embodiment. Nonetheless, it is desirable to heat the substrate to 1250° C. or less if the Ge composition exceeds 25%, or to 1230° C. or less if the Ge composition exceeds 30%. Since the SiGe layer 21 becomes thin and its Ge concentration rises at the same time during the heating process, it is necessary to lower the heating temperature gradually.

In the present embodiment, to provide an SGOI structure by performing oxidation and Ge condensation on the SiGe layer 21 formed on the SOI substrate 10, the oxide protective film 23 is formed at a low temperature on the surface before the high-temperature oxidation is carried out. Then, the substrate 10 is heated to a predetermined temperature in a non-oxidizing atmosphere to perform the oxidation and Ge condensation. It is possible to provide SGOI structure that has a low density of threading dislocations. A Si layer is grown on the SiGe layer 21, thereby forming a strained Si layer. A MOSFET is fabricated on this strained Si layer, providing a high-performance device that has high channel mobility.

Second Embodiment

Figure 3A:
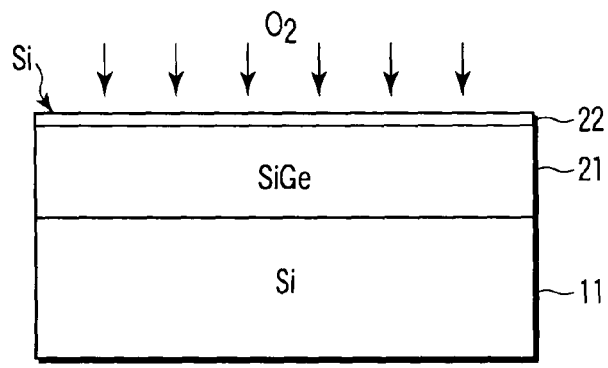
FIGS. 3A to 3C are sectional views showing the steps of manufacturing a semiconductor device according to a second embodiment of this invention.
Figure 3B:
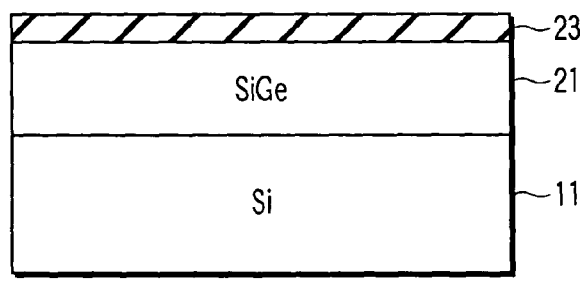
Figure 3C:
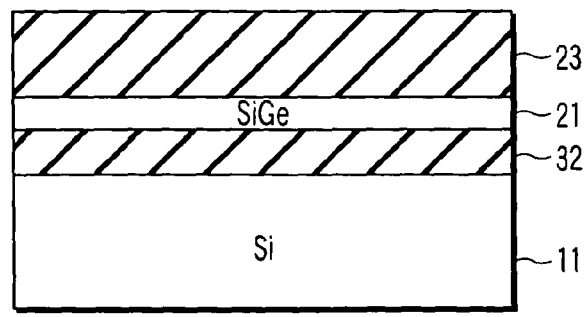
Figure 6:
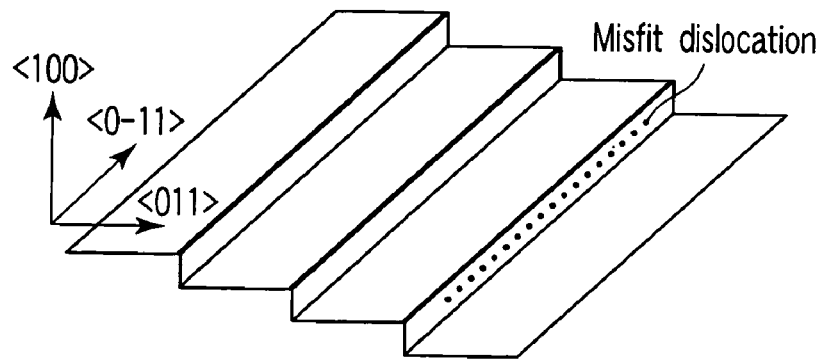
FIG. 6 is a schematic diagram explaining the third embodiment, depicting the relation between the substrate tilting a little and the misfit dislocation.

FIGS. 3A to 3C are sectional views showing the steps of manufacturing a semiconductor device according to a second embodiment of this invention. The components identical to those of the first embodiment are designated at the same reference numerals and will not be described in detail.

As described above, two oxidation steps are performed in the first embodiment. Two oxidation steps can be performed not only in an sample comprising a thin SOI substrate and a SiGe layer grown as crystal on the SOI substrate, but also applied to SIMOX processes. For example, a SiGe crystal layer (Ge composition of 10%) having thickness of 0.3 μm is formed on a Si substrate, and a Si cap layer (20 nm thick) is formed on the SiGe crystal layer. Oxygen ions are implanted into the substrate and the two oxidation steps are carried out. The SiGe crystal layer provided on the oxygen-added Si crystal layer therefore undergoes lattice relaxation. This achieves the same advantage as in the case where a high-quality SiGe crystal layer is formed on an oxide film.

To be more specific, a SiGe layer 21 is formed on a Si substrate 11, and a Si cap layer 22 is formed on the SiGe layer 21, as is illustrated in FIG. 3A. Thereafter, oxygen ions are implanted into the Si substrate 11 through the SiGe layer 21 at an acceleration voltage of 160 keV and at a dose of $4 \times 10^{17}$ atoms/cm². Then, the resultant structure is subjected to oxidation at a relatively low temperature (first thermal oxidation). An oxide film 23 is thereby formed as shown in FIG. 3. The structure is then heated to 1350° C. in a non-oxidizing atmosphere. After the temperature becomes stable, a high-temperature heat treatment (second thermal oxidation) is carried out in an oxygen-rich atmosphere. A buried oxide film 32 is thereby formed as illustrated in FIG. 3C. At the same time, the oxide film 23 provided on the surface grows thicker. Therefore, Ge concentration can rise in the SiGe layer 21 that interposed between both oxide films 23 and 32, and the thickness of the SiGe can be decreased.

It has been confirmed that the protective Si layer on the surface is etched in the SIMOX process, in which ion-beam sputtering is carried out. It is therefore required that the Si layer 22 be so thick that the Si cap layer remains during the first thermal oxidation that follows the ion implantation. In order to form silicon di-oxide layer at the region into which oxygen ions have been implanted, annealing must be carried out at a high temperature (i.e., 1350° C.). If the initial oxide film that protects the surface is thin, it may fail to protect the surface layer as the temperature rises. In view of this, the initial oxide film should be 30 to 50 nm thick. To protect the surface, it is effective to introduce a small amount of oxygen by which oxidation can not proceed. If the protection film is thin, Ge atoms will react with oxygen atoms, causing evaporation, and then, the surface becomes rough.

In the SIMOX process, the step of forming a buried oxide film from the oxygen-implanted layer and the step of forming an SGOI layer having high Ge concentration by means of oxidation and Ge condensation may be performed at different times, as is illustrated in FIG. 4. More precisely, after the first thermal oxidation is completed, the structure may be heated to 1350° C. in a non-oxidizing atmosphere, and then annealing may be continued at 1350° C. for four hours. Thereafter, the temperature may be lowered to 1200° C. and oxygen is introduced, performing the second thermal oxidation for a predetermined time.

As indicated above, the oxidation temperature cannot be raised in the oxidation and Ge condensation step (i.e., second thermal oxidation) if the Ge concentration required is high because SiGe crystal has a low melting point. The temperature required in the step of forming the buried oxide film is as high as 1350° C. Hence, the oxidation and Ge condensation step and the step of forming the buried oxide film can be efficiently performed if they are carried out at different times as shown in FIG. 4.

The heat treatment is thus performed at 1350° C. in the non-oxidizing atmosphere, forming a buried oxide film 32 of good quality by using the SiGe layer having Ge concentration of 10%. After the buried oxide film 32 is formed, the temperature is lowered to 1200° C., performing the oxidation and Ge condensation step (i.e., second thermal oxidation). It is therefore possible to obtain a SiGe crystal layer 21 that has Ge concentration of 30%. In this embodiment, oxygen gas is used to provide an oxidizing atmosphere for the second thermal oxidation. Instead, an atmosphere containing a large amount of water vapor (H2O) may be used. Obviously, the same advantage can be attained in this case, too.

The initial oxide film thus formed in the first thermal oxidation protects the surface layer during the step of raising the temperature. This can suppress the introduction of dislocation. Thus, the second embodiment can achieve the same advantage as the first embodiment.

Third Embodiment

In the first embodiment, a SiGe layer is formed on an SOI substrate having (100) plane, and a Si cap layer is formed on the SiGe layer, thereby forming an relaxed SGOI layer by means of oxidation and Ge condensation. In this step, the first oxidation that forms a protective film is performed at a low temperature of 1000° C. or less. This makes it possible to suppress the threading dislocations very much during the subsequent oxidation and Ge condensation (second thermal oxidation) that is carried out at high temperature. Hence, an SGOI substrate having a low density of dislocation can be provided.

If an SGOI substrate having low dislocation density is formed by using the oxidation and Ge condensation and further condensation is required for a higher Ge concentration, plane defects, i.e., slip planes that are (111) planes or similar planes, may develop. Some of these plane defects have misfit dislocation at the interface between the buried oxide film and the SGOI layer. The other plane defects are twin crystals that do not have such misfit dislocation. Since the slip planes are (111) plane or equal planes, misfit dislocations appear on <011> axis or <0$\bar{1}$1> axis.

Not only defect generation, but also misfit dislocations are generated toward two orthogonal directions, when the plane defects or the twin crystal planes crosses. As is known in the art, the misfit dislocation promotes the diffusion of impurities in the crystal along the misfit dislocation. The irregular distribution of impurities brings the error of devices. Hence, the direction in which plane defects are introduced should be controlled.

The present embodiment provides a method of controlling the direction in which plane defects are introduced, by using a substrate whose crystal axis in the surface tilts a little. The method will be explained, with reference to FIG. 5. First, a SOI substrate is prepared as the initial substrate. This SOI substrate has a buried oxide film 51 and a Si layer 52 provided on the buried oxide film 51. The SOI substrate has a crystal axis in the surface of the Si layer 52, which tilts by angle θ (e.g., 1°) from the <100> axis toward the <011> axis. To form such an SOI substrate, the SIMOX process can be employed, which comprises the step of implanting oxygen ions into a bulk Si substrate having a small tilting angle, and the step of performing high-temperature annealing. A process other than the SIMOX process may be alternatively employed, in which a bulk Si substrate having a small tilting angle is thermally oxidized at the surface and then bonded to the base substrate.

A thin SiGe crystal layer 52 is deposited on the SOI substrate thus prepared and having a small tilting angle, and a Si cap layer (not shown) is deposited on the SiGe crystal layer 52, as in the first embodiment. The SiGe layer has Ge composition of 10% and is 300 nm thick. The Si cap layer is 10 nm thick. Note that SiGe layer and the Si cap layer are formed in conditions that are determined in the same way as in the first embodiment. The resultant structure is subjected to the first oxidation at 900° C. and heated in a non-oxidizing atmosphere. A high-temperature oxidation and Ge condensation (second oxidation) is then performed on the structure, providing an SGOI substrate. The first oxidation and the second oxidation are carried out in the conditions that are determined in the same way as in the first embodiment.

The SGOI substrate thus provided has atom steps in the surface, along <011> axis at the intervals of about 15 nm. Misfit dislocation from which plane defects may generate are likely to occur at these steps. In view of this, misfit dislocation is introduced along <0$\bar{1}$1> axis that is perpendicular to the direction in which the substrate tilts. As a result, the plane defects or twin crystals generated, namely, the misfit location, can be oriented in one direction.

Figure 7:
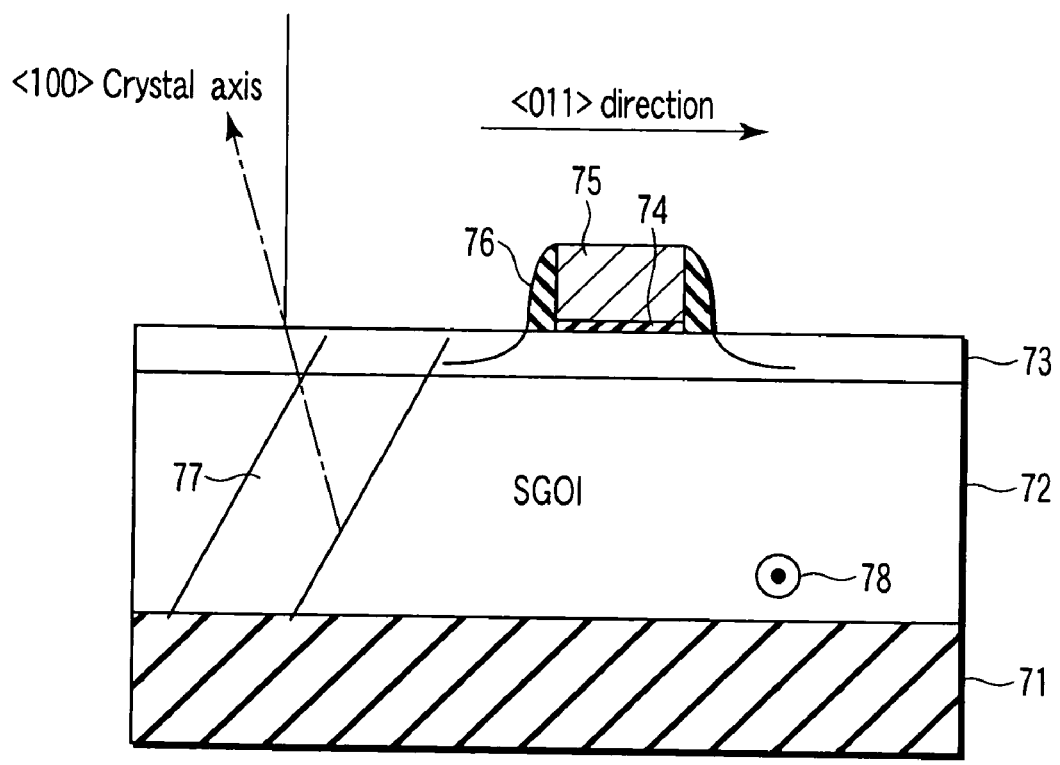
FIG. 7 is a sectional view showing the structure of an MOSFET device manufactured by using an SGOI substrate obtained in the third embodiment.

FIG. 7 shows the structure of an MOSFET device that has been made through re-growth of a Si channel layer on the SGOI substrate obtained in the third embodiment. This structure comprises a buried oxide film 71, an SGOI layer 72, a strained Si layer 73, a gate insulating film 74, a gate electrode 75, a sidewall insulating film 76, and a twin crystal 77. As FIG. 7 shows, misfit dislocation 78 has generated in the SGOI substrate 71.

The source and drain regions are arranged along <011> axis to which the substrate tilts. The source and drain regions have been formed by ion implanting of p-type or n-type impurities and by activation annealing, in the same way as in fabricating ordinary MOSFETs.

As described above, misfit dislocation, if any in the crystal, enhances the diffusion of impurities that proceeds along the dislocation. Consequently, if misfit dislocation extends over the source and the drain, the impurities implanted will greatly diffuse, causing junction leakage or short circuit between the source and the drain.

Nevertheless, misfit dislocation can be introduced exclusively in the direction perpendicular to the direction in which the substrate tilts a little, because the source and the drain are arranged in a specific manner in this embodiment. The misfit location extending between the source and the drain can therefore be reduced in magnitude. This decreases the leakage current between the source and the drain.

In the present embodiment, the initial SOI substrate has (100) plane and tilts by 0.5 to 2° toward <011> axis. The embodiment can therefore provide an SGOI structure in which plane defects are introduced in the direction perpendicular to the direction in which the substrate tilts. Since a current flows in the FET in the direction perpendicular to the direction in which the plane defects have been introduced, the FET can be achieved in which only a small leakage current flows.

(Modification)

The present invention is not limited to the embodiments described above. In the first embodiment, a SiGe layer is formed on the Si layer provided on the buried oxide film. Instead, the SiGe layer may be formed directly on the buried oxide film. In the first and second embodiments, a Si cap layer is formed on the SiGe layer, thus providing a protective oxide film on the surface of the SiGe layer, before the oxidation and Ge condensation is carried out. Nonetheless, the Si cap layer can be dispensed with. This is because, without the Si cap layer, an oxide film can be formed on the SiGe layer by means of a subsequent oxidation process.

In the third embodiment, not only by using a tilting substrate, but also by employing the temperature ramping up under non-oxidizing atmosphere as in the first second embodiments, the SGOI substrate with low dislocation density can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a substrate including one of a layer containing oxygen and Si atoms and a layer containing oxygen, Si atoms and Ge atoms, and a SiGe layer formed on the layer;

performing heat treatment on the substrate at a first temperature equal to or lower than 1000° C. to form a protective oxide film on a surface of the SiGe layer;

heating the substrate including the protective oxide film, in a non-oxidizing atmosphere to a second temperature higher than 1000° C., without oxidizing the SiGe layer; and performing heat treatment on the substrate heated up to the second temperature, in an oxidizing atmosphere at a temperature equal to or higher than the second temperature, to form a buried oxide film in the substrate, and oxidize the SiGe layer, make the SiGe layer thinner and increase Ge concentration in the SiGe layer for forming a SiGe layer having the increased Ge concentration in the vicinity of the buried oxide film, wherein the heating the substrate includes raising a temperature of the substrate to a third temperature higher than the second temperature and heating the substrate at the third temperature for a predetermined time, and which further includes, after the heating, cooling the substrate to the temperature at which the heat treatment is performed in the oxidizing atmosphere.

2. The method according to claim 1, wherein the preparing the substrate includes implanting oxygen ions into a Si substrate after the SiGe film is formed on the Si substrate.

3. The method according to claim 1, wherein the first temperature is 1000° C. and the second temperature is 1100° C.

4. The method according to claim 1, wherein the preparing the substrate includes forming a Si protective film on the SiGe layer.

5. The method according to claim 1, further including forming a Si layer on the SiGe layer having the increased Ge concentration to impart lattice strain to the Si layer.

6. The method according to claim 5, further including fabricating an MOS transistor on the Si layer having the lattice strain.

7. A method of manufacturing a semiconductor device, comprising:

forming a SiGe layer on a major surface of an SOI substrate, which has an orientation axis tilting by 0.5 to 2 degree from <100> axis to <011> axis;

heating the substrate at a first temperature equal to or lower than 1000° C. to form a protective oxide film on a surface of the SiGe layer; and performing a heat treatment on the substrate including the protective oxide film, in an oxidizing atmosphere at a second temperature higher than 1000° C. to oxidize the SiGe layer and make the SiGe layer thinner for forming a SiGe layer having an increased Ge concentration.

8. The method according to claim 7, further including heating the substrate to the second temperature in a non-oxidizing atmosphere after the protective film is formed and before the heat treatment is performed in an oxidizing atmosphere.

9. The method according to claim 7, wherein the first temperature is 1000° C. and the second temperature is 1100° C.

10. The method according to claim 7, further including forming a Si layer on the SiGe layer having the increased Ge concentration to impart lattice strain to the Si layer.

11. The method according to claim 10, further including fabricating an MOS transistor on the Si layer having the lattice strain.

* * * * *

UNITED STATES PATENT AND TRADEMARK OFFICE
CERTIFICATE OF CORRECTION

PATENT NO. : 7,759,228 B2
APPLICATION NO. : 11/449687
DATED : July 20, 2010
INVENTOR(S) : Sugiyama et al.

It is certified that error appears in the above-identified patent and that said Letters Patent is hereby corrected as shown below:

Title Page, Item (57), in the Abstract, lines 11-12, change "to form oxide the SiGe layer," to --to oxidize the SiGe layer,--.

Claim 7, column 10, lines 28-29, change "0.5 to 2 degree" to --0.5 to 2 degrees--.

Signed and Sealed this

Second Day of November, 2010

David J. Kappos
*Director of the United States Patent and Trademark Office*